(12) United States Patent
Babu et al.

(10) Patent No.: US 12,100,577 B2
(45) Date of Patent: Sep. 24, 2024

(54) HIGH CONDUCTANCE INNER SHIELD FOR PROCESS CHAMBER

(71) Applicant: APPLIED MATERIALS, INC., Santa Clara, CA (US)

(72) Inventors: Sarath Babu, Singapore (SG); Ananthkrishna Jupudi, Singapore (SG); Yueh Sheng Ow, Singapore (SG); Junqi Wei, Singapore (SG); Kelvin Boh, Singapore (SG); Yuichi Wada, Chiba (JP); Kang Zhang, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 143 days.

(21) Appl. No.: 16/664,117

(22) Filed: Oct. 25, 2019

(65) Prior Publication Data

US 2021/0066050 A1 Mar. 4, 2021

Related U.S. Application Data

(60) Provisional application No. 62/893,175, filed on Aug. 28, 2019.

(51) Int. Cl.
*H01J 37/32* (2006.01)

(52) U.S. Cl.
CPC .. *H01J 37/32495* (2013.01); *H01J 37/32477* (2013.01); *H01J 37/32633* (2013.01);
(Continued)

(58) Field of Classification Search
CPC ........... C23C 16/4404; C23C 16/45591; H01J 37/32477; H01J 37/32495;
(Continued)

(56) References Cited

U.S. PATENT DOCUMENTS 5,670,218 A * 9/1997 Baek ..................... C23C 16/409
118/50
5,762,748 A 6/1998 Banholzer et al.
(Continued)

FOREIGN PATENT DOCUMENTS

TW D117574 6/2007
TW D117575 6/2007
(Continued)

OTHER PUBLICATIONS

Search Report for Taiwan Design Application No. 109300959, dated Jan. 8, 2021.
(Continued)

*Primary Examiner* — Benjamin Kendall
(74) *Attorney, Agent, or Firm* — Moser Taboa

(57) ABSTRACT

Embodiments of process kits for use in a process chamber are provided herein. In some embodiments, a process kit for use in a process chamber includes a tubular body having a central opening configured to surround a substrate support, wherein sidewalls of the tubular body do not include any through holes; and a top plate coupled to an upper end of the tubular body and substantially covering the central opening, wherein the top plate has a gas inlet and has a diameter that is greater than an outer diameter of the tubular body, and wherein the tubular body extends straight down from the top plate.

20 Claims, 4 Drawing Sheets

(52) U.S. Cl.
CPC .. *H01J 37/32642* (2013.01); *H01J 37/32715* (2013.01); *H01J 37/32834* (2013.01); *H01J 2237/2007* (2013.01); *H01J 2237/335* (2013.01)

(58) Field of Classification Search
CPC ........... H01J 37/32633; H01J 37/32642; H01J 37/32715; H01J 37/32834; H01J 2237/0268; H01J 2237/335; H01J 2237/2007
See application file for complete search history.

(56) References Cited

U.S. PATENT DOCUMENTS

| | | | |
|---|---|---|---|
| 6,583,064 B2 | 6/2003 | Wicker et al. | |
| D557,425 S | 12/2007 | Nakamura et al. | |
| 7,981,262 B2 | 7/2011 | Pavloff et al. | |
| D642,605 S | 8/2011 | Ishikawa et al. | |
| D655,258 S | 3/2012 | Honma et al. | |
| 8,444,926 B2 * | 5/2013 | Fodor | C23C 16/46 156/345.37 |
| D693,782 S | 11/2013 | Mori et al. | |
| D703,160 S | 4/2014 | Tanimura | |
| D711,331 S | 8/2014 | Lau et al. | |
| D716,239 S | 10/2014 | Lau et al. | |
| D802,790 S | 11/2017 | Tauchi et al. | |
| D804,436 S | 12/2017 | Tauchi et al. | |
| 9,865,437 B2 | 1/2018 | Chia et al. | |
| D812,578 S | 3/2018 | Uemura et al. | |
| D827,592 S | 9/2018 | Ichino et al. | |
| D830,981 S | 10/2018 | Jeong et al. | |
| D840,364 S | 2/2019 | Ichino et al. | |
| D840,365 S | 2/2019 | Ichino et al. | |
| D855,027 S | 7/2019 | Okajima et al. | |
| D891,382 S | 7/2020 | Koppa et al. | |
| D893,441 S | 8/2020 | Rao et al. | |
| D901,407 S | 11/2020 | Kouzuma et al. | |
| D913,979 S * | 3/2021 | Babu | D13/182 |
| 2002/0069970 A1 * | 6/2002 | Noorbakhsh | H01J 37/32633 118/724 |
| 2004/0060658 A1 * | 4/2004 | Nishimoto | H01J 37/32834 156/345.1 |
| 2004/0060661 A1 * | 4/2004 | Nishimoto | C23C 16/4404 156/345.43 |
| 2004/0149216 A1 | 8/2004 | Osada et al. | |
| 2006/0213438 A1 * | 9/2006 | Ishizaka | C23C 16/4404 118/715 |
| 2007/0113783 A1 | 5/2007 | Lee et al. | |
| 2008/0169183 A1 * | 7/2008 | Hertel | H01J 37/32412 204/164 |
| 2009/0188625 A1 * | 7/2009 | Carducci | H01J 37/32623 156/345.34 |
| 2010/0252417 A1 * | 10/2010 | Allen | H01J 37/3452 204/192.12 |
| 2010/0291319 A1 | 11/2010 | Yamashita et al. | |
| 2011/0006038 A1 * | 1/2011 | Kutney | H01J 37/32449 156/345.33 |
| 2011/0108524 A1 | 5/2011 | Dhindsa et al. | |
| 2013/0098554 A1 | 4/2013 | Chhatre et al. | |
| 2013/0284700 A1 | 10/2013 | Nangoy et al. | |
| 2014/0196848 A1 * | 7/2014 | Chia | H01J 37/3405 156/345.3 |
| 2016/0189936 A1 * | 6/2016 | Chia | C23C 16/45563 156/345.33 |

FOREIGN PATENT DOCUMENTS

| | | |
|---|---|---|
| TW | D117576 | 6/2007 |
| TW | D117577 | 6/2007 |
| TW | D117578 | 6/2007 |
| TW | D142852 | 9/2011 |
| TW | 201635412 A | 10/2016 |
| TW | D198930 | 8/2019 |

OTHER PUBLICATIONS

International Search Report and Written Opinion for PCT/US2020/048302 dated Dec. 4, 2020.

* cited by examiner

HIGH CONDUCTANCE INNER SHIELD FOR PROCESS CHAMBER

CROSS-REFERENCE TO RELATED APPLICATIONS

This application claims benefit of U.S. provisional patent application Ser. No. 62/893,175, filed Aug. 28, 2019 which is herein incorporated by reference in its entirety.

FIELD

Embodiments of the present disclosure generally relate to substrate processing equipment and, more specifically, to a process kit for use in substrate processing equipment.

BACKGROUND

Process chambers configured to perform a preclean process are known. For example, such chambers are configured to remove native oxide on metal contact pads of a substrate prior to physical vapor deposition (PVD) for depositing one or more barrier layers, e.g., titanium (Ti), copper (Cu), etc., on the substrate and to remove other materials. Preclean chambers, typically, use ion bombardment (induced by RF plasma) to remove the native oxide on the metal contact pads and other materials. For example, the preclean process can etch the native oxide and material from the substrate. The preclean process is configured to lower contact resistance between the metal contacts on the substrate to enhance performance and power consumption of integrated circuits on the substrate and to promote adhesion.

To perform a plasma cleaning process, an integrated circuit is placed in a plasma chamber and a pump removes most of the air from the chamber. Electromagnetic energy (e.g., radio frequency) is applied to an injected gas, such as argon, to excite the injected gas into a plasma state. The plasma releases ions that bombard the surface of the substrate to remove contaminants and/or material from the substrate. Atoms or molecules of the contaminants and/or substrate material are etched from the substrate and are, for the most part, pumped out of the chamber. However, some of the contaminant and/or etched material may be deposited on surfaces of the chamber. Process kits are typically used to reduce or prevent deposition of contaminants and/or etched materials onto surfaces of the chamber. However, for certain plasma cleaning or etching processes having increased contaminants or etched material, a process kit may not provide adequate flow conductance for removing displaced materials.

Accordingly, the inventors have provided embodiments of improved process kits.

SUMMARY

Embodiments of process kits for use in a process chamber are provided herein. In some embodiments, a process kit for use in a process chamber includes a tubular body having a central opening configured to surround a substrate support, wherein sidewalls of the tubular body do not include any through holes; and a top plate coupled to an upper end of the tubular body and substantially covering the central opening, wherein the top plate has a gas inlet and has a diameter that is greater than an outer diameter of the tubular body, and wherein the tubular body extends straight down from the top plate.

In some embodiments, a process kit for use in a process chamber includes a tubular body configured to surround a substrate support; and a top plate coupled to an upper end of the tubular body, wherein the top plate incudes a countersink and a central opening disposed in the counter sink and extending through the top plate, wherein the top plate includes an upper portion and a lower portion, and wherein the upper portion extends radially outward of the lower portion and an outer surface of the lower portion is coplanar with an outer surface of the tubular body.

In some embodiments, a process chamber includes a chamber body defining an interior volume and having a pump port; an adapter disposed on sidewalls of the chamber body; a substrate support disposed in the interior volume; an inner shield mounted on the adapter and surrounding the substrate support, wherein the inner shield includes a tubular body and a top plate coupled to an upper end of the tubular body, wherein the top plate includes a gas inlet having a diameter less than the substrate support and an upper surface of the top plate includes an first annular recess, and wherein the inner shield defines an upper portion of a processing volume; and a pump coupled to the pump port and configured to remove particles from the interior volume through a gap between the tubular body and the substrate support.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
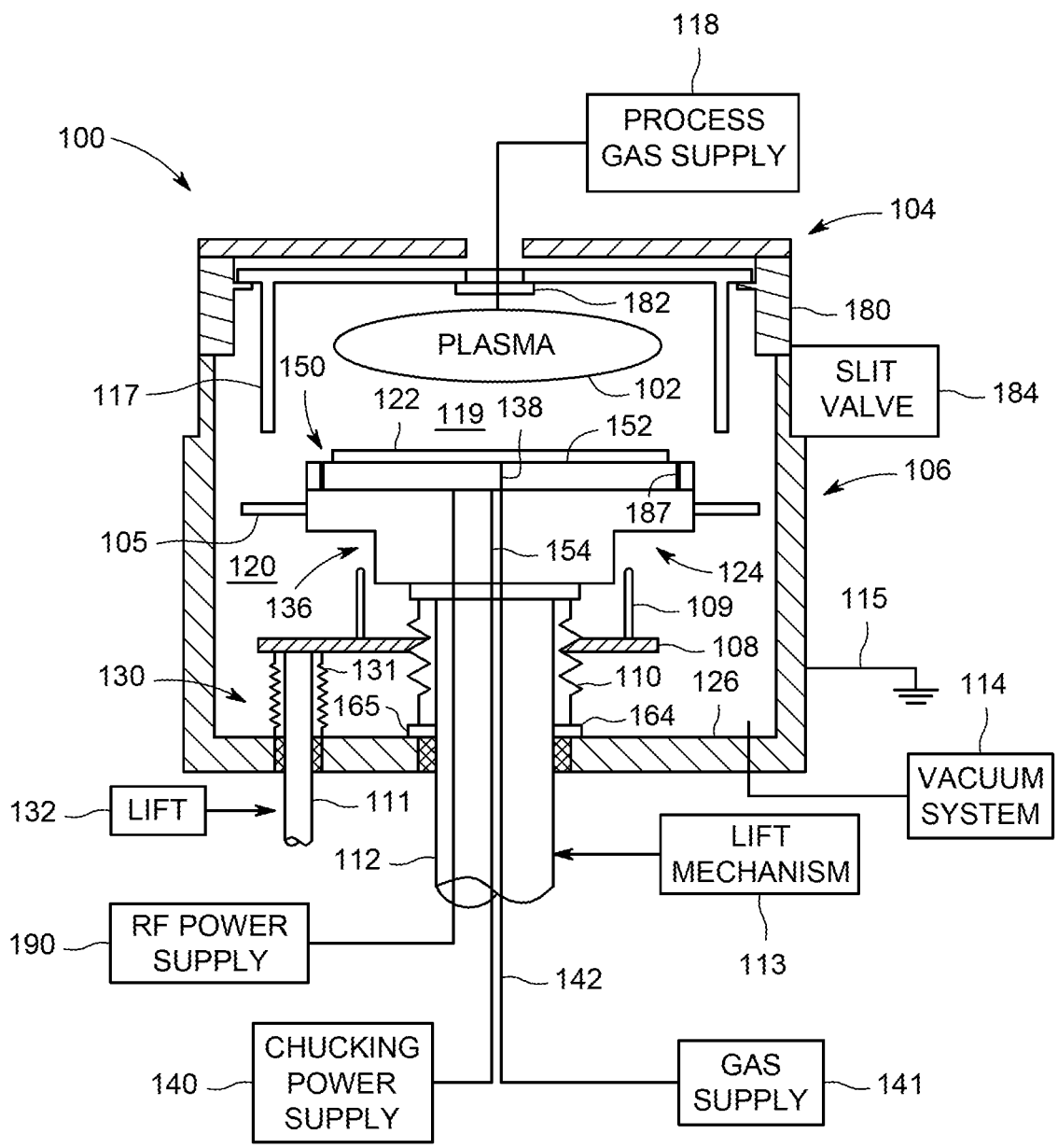
FIG. 1 depicts a schematic side view of a process chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of process kits for use in a process chamber are provided herein. The process chamber may be configured to perform any suitable process to a substrate. In some embodiments, the process chamber is configured to perform an etch process, a deposition process, or a preclean process. The process chamber includes a substrate support to support the substrate. A pump may be coupled to the process chamber to remove particles from an interior volume of the process chamber. The inventors have discovered that substrates comprising organic materials have increased levels of outgassing as compared to conventional substrates during processing. A process kit is disposed about the substrate support to advantageously reduce or prevent deposition of unwanted materials onto a chamber body of the process chamber while also providing a high conductance through the process kit.

FIG. 1 depicts a schematic side view of a process chamber (e.g., a plasma processing chamber) having a process kit in accordance with at least some embodiments of the present disclosure. In some embodiments, the plasma processing chamber is a preclean processing chamber. However, other types of process chambers configured for different processes can also use or be modified for use with embodiments of the process kit described herein.

The chamber 100 is a vacuum chamber which is suitably adapted to maintain sub-atmospheric pressures within an interior volume 120 during substrate processing. In some embodiments, the chamber 100 can maintain a pressure of about 1 mTorr to about 10 mTorr. The chamber 100 includes a chamber body 106 covered by a lid 104 which encloses a processing volume 119 located in the upper half of the interior volume 120. In some embodiments, the chamber 100 includes an adapter 180 disposed between the chamber body 106 and the lid 104 and resting on sidewalls of the chamber body 106. The chamber 100 includes a process kit circumscribing various chamber components to prevent unwanted reaction between such components and etched material and other contaminants. The chamber body 106, the adapter 180, and the lid 104 may be made of metal, such as aluminum. The chamber body 106 may be grounded via a coupling to ground 115.

A substrate support 124 is disposed within the interior volume 120 to support and retain a substrate 122, such as a semiconductor wafer, for example, or other such substrate as may be electrostatically retained. The substrate support 124 may generally comprise a pedestal 136 (described in more detail below with respect to FIG. 2) and a hollow support shaft 112 for supporting the pedestal 136. The pedestal 136 includes an electrostatic chuck 150. In some embodiments, the electrostatic chuck 150 comprises a dielectric plate. The hollow support shaft 112 provides a conduit to provide, for example, backside gases, process gases, fluids, coolants, power, or the like, to the electrostatic chuck 150. In some embodiments, the substrate support 124 includes an edge ring 187 disposed about the electrostatic chuck 150. In some embodiments, the edge ring 187 is made of alumina ($Al_2O_3$). A slit valve 184 may be coupled to the chamber body 106 to facilitate transferring the substrate 122 into and out of the interior volume 120.

In some embodiments, the process kit includes an inner shield 117 circumscribing the substrate support 124. In some embodiments, the inner shield 117 rests on the adapter 180. In some embodiments, the inner shield 117 is configured to define the processing volume 119. In some embodiments, the inner shield 117 is made of metal such as aluminum. In some embodiments, the process kit includes a lower shield 105 circumscribing the substrate support 124. In some embodiments, the lower shield 105 is coupled to the pedestal 136. In some embodiments, the lower shield 105 is made of metal such as aluminum.

In some embodiments, the hollow support shaft 112 is coupled to a lift mechanism 113, such as an actuator or motor, which provides vertical movement of the electrostatic chuck 150 between an upper, processing position, and a lower, transfer position. A bellows assembly 110 is disposed about the hollow support shaft 112 and is coupled between the electrostatic chuck 150 and a bottom surface 126 of chamber 100 to provide a flexible seal that allows vertical motion of the electrostatic chuck 150 while reducing or preventing loss of vacuum from within the chamber 100. The bellows assembly 110 also includes a lower bellows flange 164 in contact with an o-ring 165 or other suitable sealing element which contacts the bottom surface 126 to help prevent loss of chamber vacuum.

A substrate lift 130 can include lift pins 109 mounted on a platform 108 connected to a shaft 111 which is coupled to a second lift mechanism 132 for raising and lowering the substrate lift 130 so that the substrate 122 may be placed on or removed from the electrostatic chuck 150. The electrostatic chuck 150 may include thru-holes to receive the lift pins 109. A bellows assembly 131 is coupled between the substrate lift 130 and bottom surface 126 to provide a flexible seal which maintains the chamber vacuum during vertical motion of the substrate lift 130.

The hollow support shaft 112 provides a conduit for coupling a backside gas supply 141, a chucking power supply 140, and a RF power supply 190 to the electrostatic chuck 150. In some embodiments, the chucking power supply 140 provides DC power to the electrostatic chuck 150 via conduit 154 to retain the substrate 122. In some embodiments, RF energy supplied by the RF power supply 190 may have a frequency of about 10 MHz or greater. In some embodiments, the RF power supply 190 may have a frequency of about 13.56 MHz.

In some embodiments, the backside gas supply 141 is disposed outside of the chamber body 106 and supplies gas to the electrostatic chuck 150. In some embodiments, the electrostatic chuck 150 includes a gas channel 138 extending from a lower surface of the electrostatic chuck 150 to an upper surface 152 of the electrostatic chuck 150. The gas channel 138 is configured to provide backside gas, such as nitrogen (N), argon (Ar), or helium (He), to the upper surface 152 of the electrostatic chuck 150 to act as a heat transfer medium. The gas channel 138 is in fluid communication with the backside gas supply 141 via gas conduit 142 to control the temperature and/or temperature profile of the substrate 122 during use. For example, the backside gas supply 141 can supply gas to cool the substrate 122 during use.

The chamber 100 is coupled to and in fluid communication with a vacuum system 114 which includes a throttle valve (not shown) and pump (not shown) which are used to exhaust the chamber 100. In some embodiments, the vacuum system 114 is coupled to a pump port disposed on the bottom surface 126 of the chamber body 106. The pressure inside the chamber 100 may be regulated by adjusting the throttle valve and/or vacuum pump. In some embodiments, the pump has a flow rate of about 1900 liters per second to about 3000 liters per second.

The chamber 100 is also coupled to and in fluid communication with a process gas supply 118 which may supply one or more process gases to the chamber 100 for processing a substrate disposed therein. In some embodiments, the lid 104 includes a port through which gas from the process gas supply 118 can be introduced into the interior volume 120. In some embodiments, the process gas supply 118 provides argon (Ar) gas. In some embodiments, a diffuser 182 is coupled to the inner shield 117 to inject gas from the process gas supply 118 into the processing volume 119. In some embodiments, the diffuser 182 is configured to inject gas into the processing volume 119 from a center of the inner shield 117.

In operation, for example, a plasma 102 may be created in the interior volume 120 to perform one or more processes. The plasma 102 may be created by coupling power from a plasma power source (e.g., RF power supply 190) to a process gas via the electrostatic chuck 150 to ignite the process gas and create the plasma 102. The RF power supply 190 is also configured to attract ions from the plasma towards the substrate 122.

Figure 2:
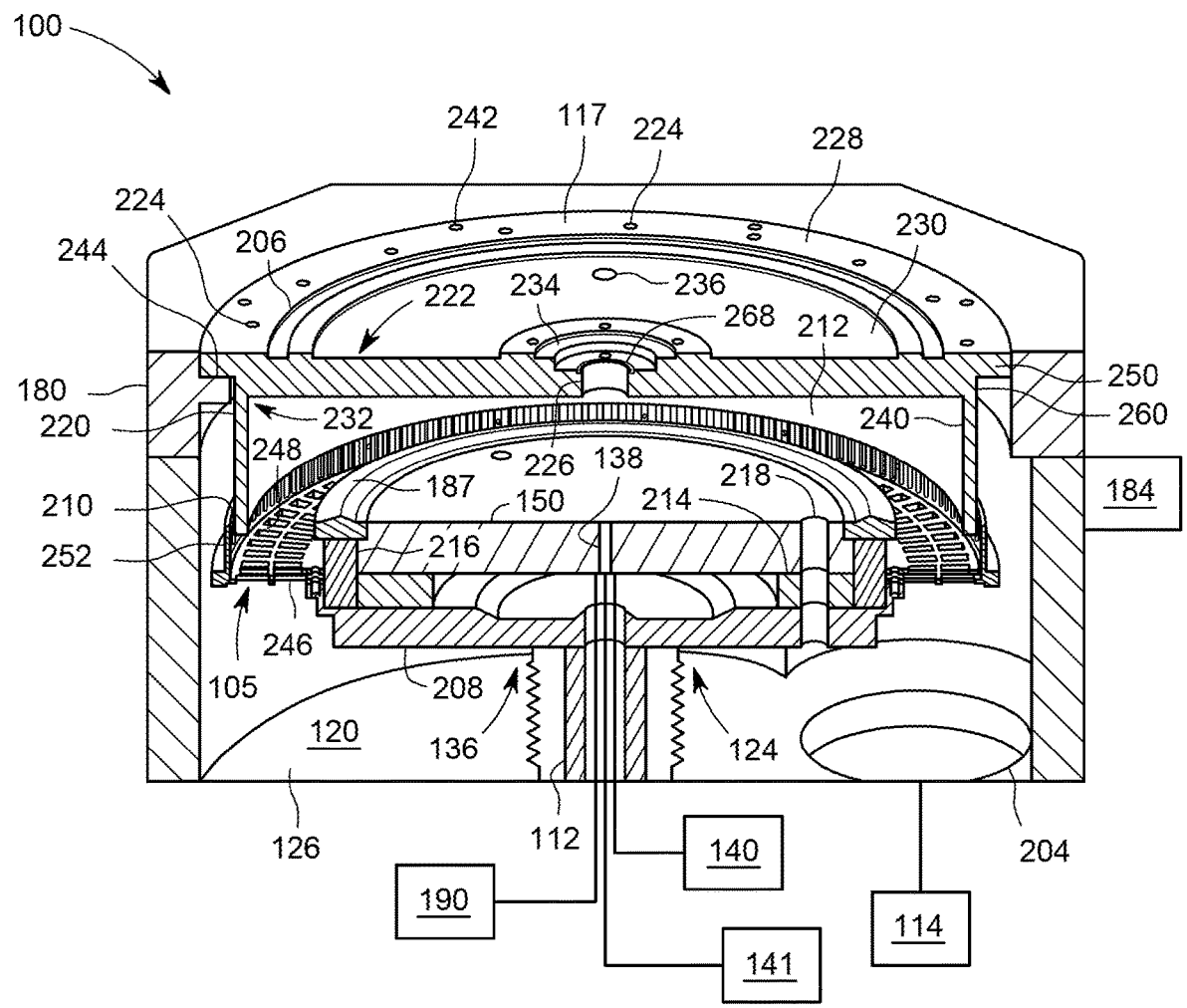
FIG. 2 depicts a partial schematic cross-sectional side view of a process chamber in accordance with at least some embodiments of the present disclosure.

FIG. 2 depicts a partial schematic cross-sectional side view of a process chamber in accordance with at least some embodiments of the present disclosure. In some embodiments, the pedestal 136 includes a bottom housing 208 formed of metal and coupled to the hollow support shaft 112. The bottom housing 208 is coupled to ground (e.g., ground 115). In some embodiments, the pedestal 136 includes the electrostatic chuck 150 disposed on the bottom housing 208 with an isolator 214 disposed therebetween. The isolator 214 is configured to electrically isolate the electrostatic chuck 150 and the bottom housing 208. In some embodiments, the isolator 214 is ring shaped. In some embodiments, one or more lift pins holes 218 extend through the bottom housing 208, the isolator 214, and the electrostatic chuck 150 to allow one or more lift pins (e.g., lift pins 109) to pass through. In some embodiments, a second isolator 216 is disposed about the isolator 214 and between the bottom housing 208 and the edge ring 187 to electrically isolate the edge ring 187 from the bottom housing 208.

In some embodiments, the inner shield 117 is mounted on the adapter 180 and surrounds the electrostatic chuck 150. In some embodiments, the inner shield 117 is disposed proximate the lid 104 to define an upper portion of the processing volume 119. The inner shield 117 is configured to confine the plasma 102 during use. In some embodiments, the inner shield 117 is coupled to the lid 104.

The inner shield 117 includes a tubular body 220 having an inner surface 212. The inner surface 212 defines a central opening 240 configured to surround the substrate support 124. In some embodiments, sidewalls of the tubular body 220 do not include any through holes. An upper end of the tubular body 220 is coupled to a top plate 222 at an interface 232. The top plate 222 substantially covers the central opening 240 at one end of the tubular body 220. In some embodiments, the top plate 222 is circular in shape. In some embodiments, the top plate 222 has a diameter that is greater than an outer diameter of the tubular body 220. In some embodiments, the tubular body 220 extends straight down from the top plate 222. In some embodiments, the central opening 240 of the tubular body 220 has a diameter of about 15.0 inches to about 19.0 inches.

In some embodiments, the top plate 222 is coupled to the tubular body 220 at the interface 232 via fasteners disposed through one or more openings 224 arranged equidistant from a center of the top plate 222. In some embodiments, the inner shield 117 is one-piece with the top plate 222 and the tubular body 220 welded, brazed, bonded, or otherwise formed together. In some embodiments, the top plate includes a plurality of mounting holes 242 configured to mount the top plate 222 to the adapter 180. In some embodiments, the plurality of mounting holes 242 are disposed radially outward of the first annular recess 206. In some embodiments, the adapter 180 includes a tab 244 extending radially inward, and the inner shield 117 is coupled to the adapter 180 via the tab 244.

In some embodiments, the top plate 222 has an upper portion 250 and a lower portion 260. In some embodiments, the upper portion 250 extends radially outward of the lower portion 260. In some embodiments, an outer diameter of the lower portion 260 is substantially the same as the outer diameter of the tubular body 220. The top plate 222 includes a gas inlet 226 configured to provide a process gas therethrough (e.g., from process gas supply 118). In some embodiments, the gas inlet 226 has a diameter less than an outer diameter of the substrate support 124.

In some embodiments, an upper surface 228 of the top plate 222 includes a first annular recess 206 configured to accommodate an o-ring to provide a vacuum seal between the inner shield 117 and the lid 104. In some embodiments, an upper surface 228 of the top plate 222 includes a second annular recess 230 exposed to atmospheric pressure to provide atmospheric cooling. In some embodiments, the second annular recess 230 is disposed radially inward of the first annular recess 206. In some embodiments, the upper surface 228 of the top plate 222 includes a third annular recess 234 about the gas inlet 226 and configured accommodate a seal to reduce or prevent gas leakage from the gas inlet 226. In some embodiments, the second annular recess 230 is disposed between the first annular recess 206 and the third annular recess 234. In some embodiments, a bottom surface of the first annular recess 206 is substantially coplanar with a bottom surface of the third annular recess 234. In some embodiments, the first annular recess 206 and the third annular recess 234 have a depth of about 0.001 inches to about 0.030 inches. In some embodiments, the second annular recess 230 has a depth greater than the first annular recess 206 and the third annular recess 234. In some embodiments, the upper surface 228 of the top plate 222 includes one or more service openings 236 configured to facilitate removal of the inner shield 117 from the chamber 100 for service or replacement. In some embodiments, the service openings 236 are disposed in the second annular recess.

In some embodiments, the lower shield 105 is coupled to the bottom housing 208 to support and ground the lower shield 105. The lower shield 105 comprises an annular ring 246 configured to surround the substrate support and an annular lip 252 extending from an upper surface 248 of the annular ring 246.

In some embodiments, the outer diameter of the tubular body 220 is less than an inner diameter of the annular lip 252 such that the annular lip 252 is disposed about the tubular body 220. In some embodiments, one or more metal straps 210 are disposed between the inner shield 117 and the lower shield 105 to advantageously ground the inner shield 117. In some embodiments, the one or more metal straps 210 are coupled to the annular lip 252. In some embodiments, the metal straps 210 are configured to contact the tubular body 220 when the chamber 100 is in the process position and configured to be spaced from the tubular body 220 when the chamber 100 is in the transfer position.

A pump port 204 is coupled to a pump (e.g., pump of vacuum system 114) and facilitates removal of particles from the interior volume 120 through a gap between the tubular body 220 and the substrate support 124.

Figure 3:
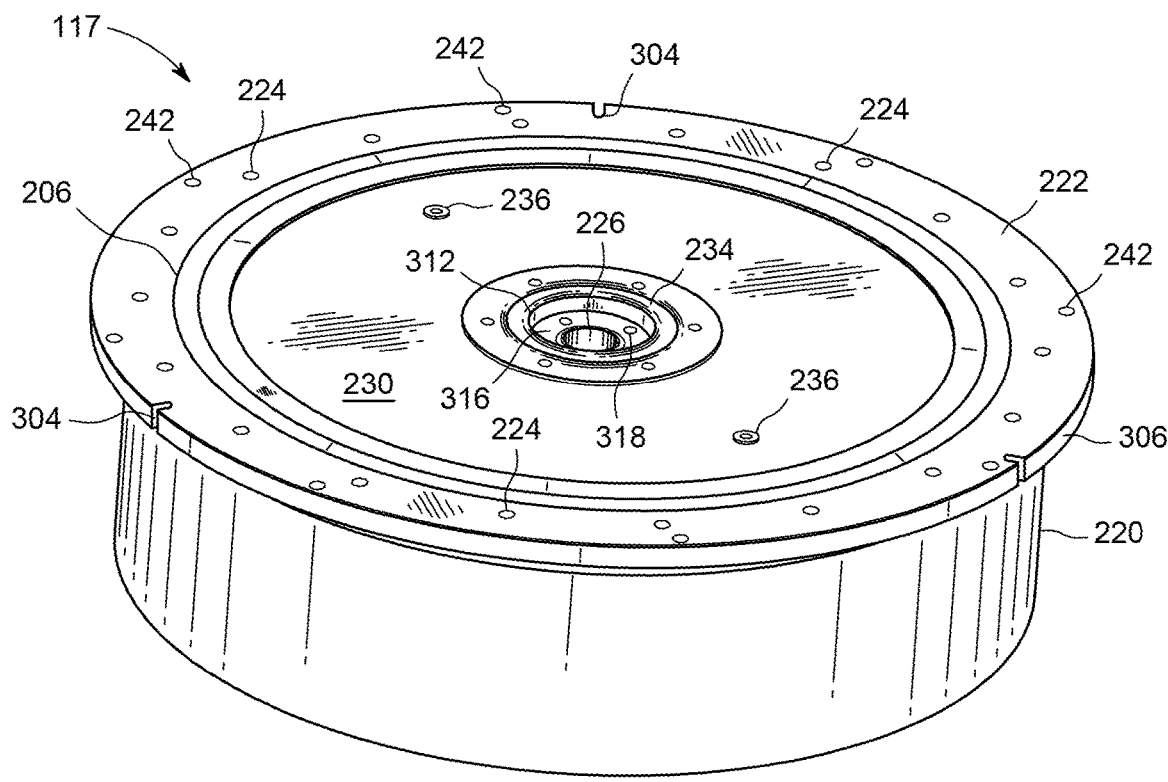
FIG. 3 depicts an isometric view of a process kit in accordance with at least some embodiments of the present disclosure.

FIG. 3 depicts an isometric view of a process kit in accordance with at least some embodiments of the present disclosure. As shown in FIG. 3, the top plate 222 of the inner shield 117 includes a countersink 312 formed on the upper surface 228 of the top plate 222. In some embodiments, the gas inlet 226 extends from the countersink 312 to a lower surface of the top plate 222. In some embodiments, the countersink 312 defines a lower surface 316 having a plurality of openings 318. In some embodiments, the plurality of openings 318 are configured to couple the top plate 222 to a diffuser, such as diffuser 182. In some embodiments, the lower surface 316 includes a RF gasket groove 268 to accommodate an RF gasket to reduce or prevent RF leak. In some embodiments, the top plate 222 includes a plurality of alignment slots 304 extending radially inward from an outer sidewall 306 of the top plate 222. In some embodiments, the upper surface 228 of the top plate 222 includes a plurality of clamp mounting holes disposed about the gas inlet 226 and configured to couple a clamp to the top plate. The clamp may be any clamp suitable for providing force to a seal disposed in the third annular recess 234 and configured to provide a seal between the gas inlet 226 and a conduit supplying gas from the process gas supply 118.

Figure 4:
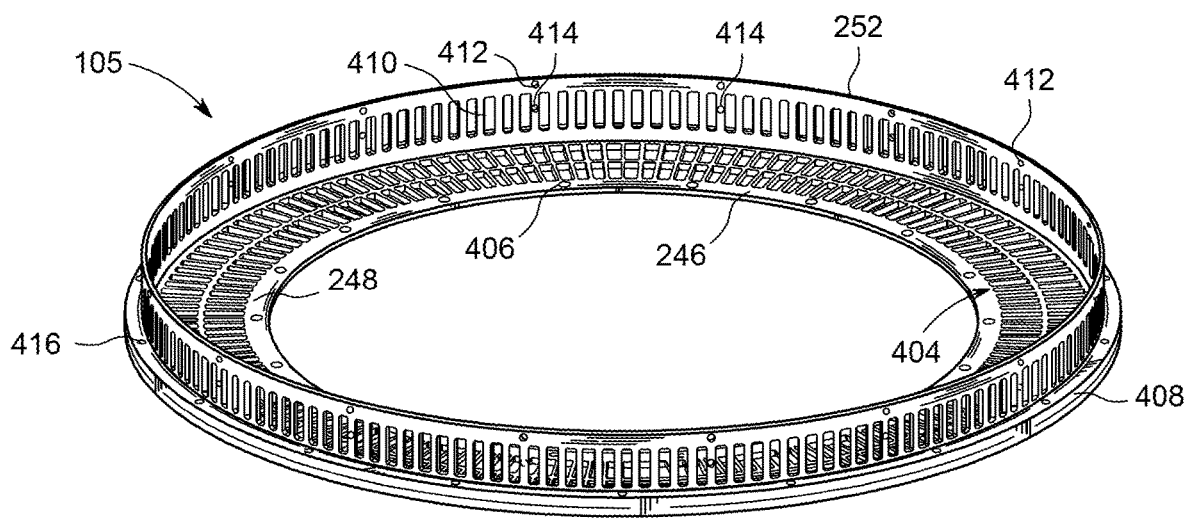
FIG. 4 depicts an isometric view of a process kit in accordance with at least some embodiments of the present disclosure.
Figure 5:
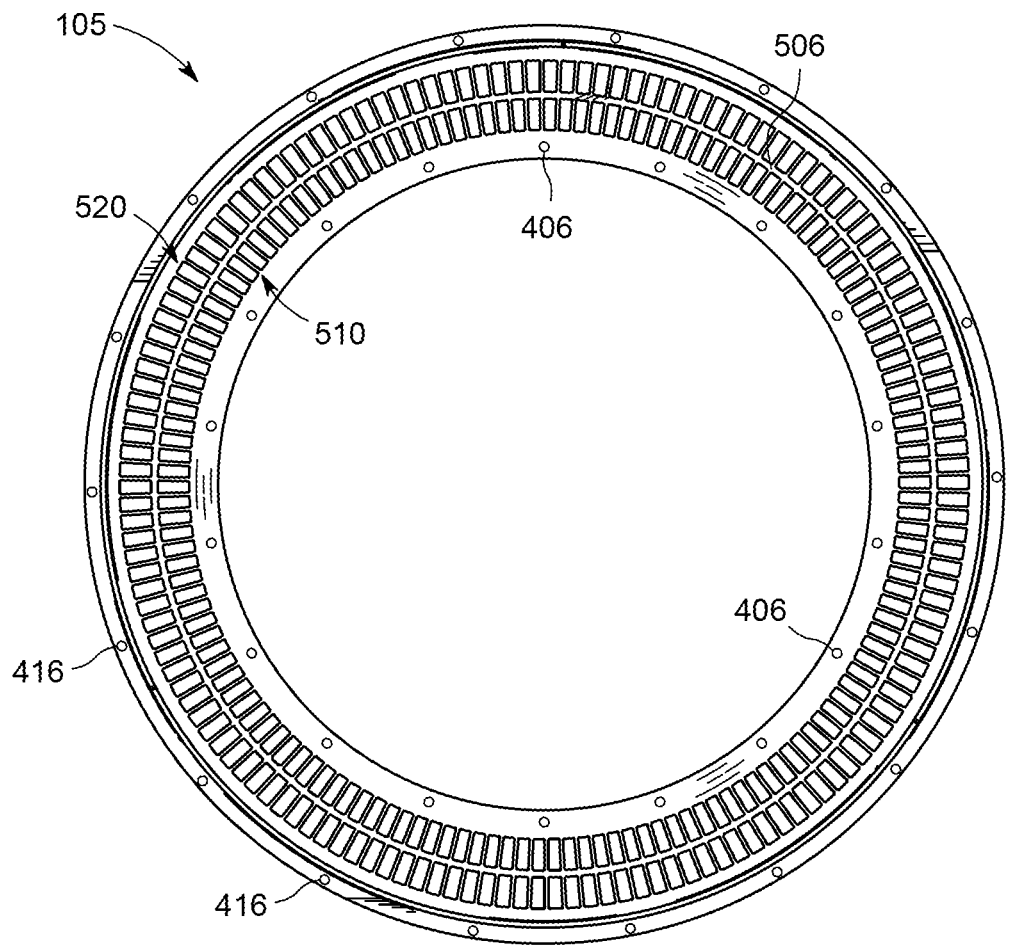
FIG. 5 depicts a top plan view of the process kit of FIG. 4.

FIGS. 4 and 5 depict an isometric view and a top plan view, respectively, of a process kit in accordance with at least some embodiments of the present disclosure. As shown in FIGS. 4 and 5, the process kit includes the lower shield 105 having the annular lip 252 extending from the upper surface 248 of the annular ring 246. In some embodiments, the annular lip 252 is disposed radially inward from an outer sidewall 408 of the annular ring 246. In some embodiments, the annular lip 252 is disposed proximate the outer sidewall 408 of the annular ring 246 and radially inward from the outer sidewall 408. In some embodiments, the annular lip 252 extends substantially perpendicularly from the annular ring 246. In some embodiments, the lower shield 105 has an outer diameter of about 16.0 inches to about 21.0 inches. In some embodiments, the lower shield 105 has a height of about 1.0 inches to about 2.0 inches.

The annular ring 246 includes a plurality of ring slots 404 extending through the annular ring 246. In some embodiments, the plurality of ring slots 404 are disposed at regular intervals along the annular ring 246. In some embodiments, the plurality of ring slots includes a plurality of first ring slots 510 and a plurality of second ring slots 520. In some embodiments, the plurality of second ring slots 520 are disposed radially outward from the plurality of first ring slots 510. In some embodiments, the annular lip 252 includes a plurality of lip slots 410 extending through the annular lip 252. In some embodiments, the plurality of lip slots 410 are disposed at regular intervals along the annular lip 252.

The plurality of ring slots 404 and the plurality of lip slots 410 are advantageously sized to provide increased conductance therethrough while minimizing plasma leak through the slots. As such, the plurality of ring slots 404 are sized based on pressure in the interior volume 120, temperature in the interior volume 120, and a frequency of the RF power provided to the chamber 100, for example via RF power supply 190. The pump port 204 is configured to facilitate removal of particles from the interior volume 120 through the plurality of ring slots 404 and the plurality of lip slots 410 of the lower shield 105.

In some embodiments, each slot of the plurality of ring slots 404 has a width less than a length. In some embodiments, the plurality of first ring slots 510 is separated from the plurality of second ring slots 520 by a gap 506. In some embodiments, the gap 506 has a substantially constant width. In some embodiments, each slot of the plurality of ring slots 404 and the plurality of lip slots 410 has a rectangular shape. While a rectangular shape is shown in FIGS. 4 and 5, the plurality of ring slots 404 and the plurality of lip slots 410 can have any suitable shape. In some embodiments, each slot of the plurality of lip slots 410 defines a larger total open area than each slot of the plurality of ring slots 404. In some embodiments, each slot of the plurality of second ring slots 520 defines a larger total open area than each slot of the plurality of first ring slots 510. In some embodiments, the plurality of second ring slots 520 comprises the same number of slots as the plurality of first ring slots 510.

In some embodiments, each slot of the plurality of ring slots 404 is about 0.08 inches to about 0.19 inches wide. In some embodiments, each slot of the plurality of ring slots 404 is about 0.60 inches to about 0.76 inches long. In some embodiments, the annular ring 246 has a total open area defined by the plurality of ring slots 404 of about 40 percent to about 60 percent of a total area of the annular ring 246. In some embodiments, the annular lip 252 has a total open area defined by the plurality of lip slots 410 of about 30 percent to about 50 percent of a total area of the annular lip 252. In some embodiments, the plurality of ring slots 404 define a total open area of about 35.0 square inches to about 45.0 square inches. In some embodiments, the plurality of lip slots 410 define a total open area of about 50.0 square inches to about 65.0 square inches.

In some embodiments, the annular ring 246 includes a plurality of openings 406 disposed radially inward of the plurality of ring slots 404 and configured to facilitate coupling the lower shield 105 to the substrate support 124 (e.g., bottom housing 208). In some embodiments, the annular ring 246 includes a plurality of indents 416 disposed radially outward of the annular lip 252 configured to reduce concentrations of material stress and for ease of manufacturing.

In some embodiments, the annular lip 252 includes a plurality of first openings 412 configured to couple the annular lip 252 to another process kit component (e.g., metal straps 210). In some embodiments, the plurality of first openings 412 are disposed at regular intervals near an upper edge of the annular lip 252. In some embodiments, the plurality of lip slots 410 are disposed between the annular ring 246 and the plurality of first openings 412. In some embodiments, a plurality of second openings 414 are disposed at regular intervals between adjacent slots of the plurality of lip slots 410. In some embodiments, the plurality of first openings 412 are vertically aligned with the plurality of second openings 414. In some embodiments, each metal strap of the one or more metal straps 210 is coupled to at least one of one of the plurality of first openings 412 and one of the plurality of second openings 414.

While the foregoing is directed to embodiments of the present disclosure, other and further embodiments of the disclosure may be devised without departing from the basic scope thereof.

The invention claimed is:

1. A process kit for use in a process chamber, comprising:
a tubular body having a central opening configured to surround a substrate support, wherein sidewalls of the tubular body do not include any through holes;
a top plate coupled to an upper end of the tubular body and substantially covering the central opening, wherein the top plate has a single gas inlet and the top plate has a diameter that is greater than an outer diameter of the tubular body, wherein the tubular body extends straight down from the top plate, and wherein an upper surface of the top plate includes a first annular recess, a second annular recess, and a third annular recess disposed radially inward of the first annular recess and configured to house an o-ring, wherein the second annular recess is disposed between and concentric with the first annular recess and the third annular recess, wherein the single gas inlet extends at a substantially constant diameter from a countersink formed on the upper surface of the top plate to a lower surface of the top plate, wherein the countersink extends from a lower surface of the third annular recess, wherein a lower surface of the second annular recess includes a plurality of service openings, wherein the top plate includes a plurality of first mounting holes disposed radially outward of the tubular body; and a lower shield comprising:
an annular ring configured to surround the substrate support; and
an annular lip extending from an upper surface of the annular ring, wherein the annular lip includes a plurality of lip slots extending through a radially outermost wall of the annular lip disposed at regular intervals along the annular lip, wherein a lower portion of the tubular body is disposed radially inward of and horizontally overlaps with the plurality of lip slots of the lower shield.

2. The process kit of claim 1, wherein the first annular recess is disposed radially inward of the tubular body.

3. The process kit of claim 1, wherein the top plate includes a plurality of second mounting holes disposed radially inward of the plurality of first mounting holes and radially outward of the first annular recess and the third annular recess.

4. The process kit of claim 1, wherein a bottom surface of the second annular recess is wider than a bottom surface of the first annular recess.

5. The process kit of claim 4, wherein the countersink defines a lower surface, and wherein the lower surface includes a plurality of openings having a diameter smaller than a diameter of the single gas inlet, wherein the plurality of openings are configured to couple the top plate to a diffuser.

6. The process kit of claim 5, wherein the lower surface of the countersink includes a RF gasket groove to accommodate an RF gasket.

7. The process kit of claim 1, wherein the process kit is made of aluminum.

8. The process kit of claim 1 further comprising:
an annular ring configured to surround the substrate support; and
an annular lip extending from an upper surface of the annular ring, wherein the annular ring includes a plurality of ring slots extending through the annular ring and disposed at regular intervals along the annular ring, wherein the annular lip includes a plurality of lip slots extending through the annular lip disposed at regular intervals along the annular lip, wherein the tubular body is disposed radially outward of the plurality of ring slots.

9. The process kit of claim 8, wherein the outer diameter of the tubular body is less than an inner diameter of the annular lip.

10. A process kit for use in a process chamber, comprising:
a tubular body configured to surround a substrate support;
a top plate coupled to an upper end of the tubular body, wherein the top plate incudes a countersink and a central opening disposed in the countersink and extending through the top plate, wherein the top plate includes an upper portion and a lower portion, and wherein the upper portion extends radially outward of the lower portion and an outer surface of the lower portion is coplanar with an outer surface of the tubular body, wherein an upper surface of the top plate includes a first annular recess configured to accommodate an o-ring and a second annular recess concentric with the first annular recess, and wherein a volume defined by the second annular recess is greater than a volume defined by the first annular recess so that the second annular recess is configured to have a greater surface area exposed to atmospheric pressure than a surface area of the first annular recess; and a lower shield comprising:
an annular ring configured to surround the substrate support; and
an annular lip extending from an upper surface of the annular ring, wherein the annular lip includes a plurality of lip slots extending through a radially outermost wall of the annular lip disposed at regular intervals along the annular lip, wherein a lower portion of the tubular body is disposed radially inward of and horizontally overlaps with the plurality of lip slots of the lower shield.

11. The process kit of claim 10, wherein the second annular recess has a depth greater than the first annular recess.

12. The process kit of claim 11, wherein the upper surface of the top plate includes a third annular recess that is concentric with and disposed radially inward of the first annular recess and the second annular recess.

13. The process kit of claim 10, wherein the upper surface of the top plate disposed between the second annular recess and the first annular recess has a width less than a width of the second annular recess and greater than a width of the first annular recess.

14. The process kit of claim 10, wherein an inner diameter of the tubular body is about 15.0 inches to about 19.0 inches.

15. The process kit of claim 10, wherein the tubular body does not include any through holes.

16. A process chamber, comprising:
a chamber body defining an interior volume and having a pump port;
an adapter disposed on sidewalls of the chamber body;
a substrate support disposed in the interior volume;
an inner shield mounted on the adapter and surrounding the substrate support, wherein the inner shield includes a tubular body and a top plate coupled to an upper end of the tubular body, wherein the top plate includes a single gas inlet, the single gas inlet having a diameter less than the substrate support, wherein the inner shield defines an upper portion of a processing volume, and wherein an upper surface of the top plate includes a first annular recess, a second annular recess, and a third annular recess disposed radially inward of the first annular recess and configured to house an o-ring, wherein the second annular recess is disposed between and concentric with the first annular recess and the third annular recess, wherein the single gas inlet extends at a substantially constant diameter from a countersink formed on the upper surface of the top plate to a lower surface of the top plate, wherein the countersink extends from a lower surface of the third annular recess, wherein a lower surface of the second annular recess includes a plurality of service openings, wherein the top plate includes a plurality of first mounting holes disposed radially outward of the tubular body;

a lower shield comprising:
an annular ring configured to surround the substrate support; and an annular lip extending from an upper surface of the annular ring, wherein the annular lip includes a plurality of lip slots extending through a radially outermost wall of the annular lip disposed at regular intervals along the annular lip, wherein a lower portion of the tubular body is disposed radially inward of and horizontally overlaps with the plurality of lip slots of the lower shield; and a pump coupled to the pump port and configured to remove particles from the interior volume through a gap between the tubular body and the substrate support.

17. The process chamber of claim 16, wherein the single gas inlet extends from a countersink formed on the upper surface of the top plate to a lower surface of the top plate.

18. The process chamber of claim 16, wherein the substrate support comprises a electrostatic chuck disposed on a bottom housing, with an isolator disposed therebetween.

19. The process chamber of claim 18, wherein the electrostatic chuck includes a gas channel extending through the electrostatic chuck and configured to flow a gas to an upper surface of the electrostatic chuck.

20. The process chamber of claim 16, wherein the pump has a flow rate of about 1900 liters per second to about 3000 liters per second.

* * * * *